United States Patent
Miyano et al.

(10) Patent No.: US 10,767,277 B2
(45) Date of Patent: Sep. 8, 2020

(54) SCAlMGO₄ SINGLE CRYSTAL SUBSTRATE AND METHOD FOR PRODUCING THE SAME

(71) Applicant: PANASONIC CORPORATION, Osaka (JP)

(72) Inventors: Kentaro Miyano, Osaka (JP); Naoto Yanagita, Toyama (JP); Naoya Ryoki, Osaka (JP); Takehiro Asahi, Hyogo (JP); Masaki Nobuoka, Nara (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/356,790

(22) Filed: Mar. 18, 2019

(65) Prior Publication Data
US 2019/0284717 A1    Sep. 19, 2019

(30) Foreign Application Priority Data
Mar. 19, 2018    (JP) .................................. 2018-050942

(51) Int. Cl.
*C30B 29/22*    (2006.01)
*C30B 15/14*    (2006.01)
(Continued)

(52) U.S. Cl.
CPC .............. *C30B 29/22* (2013.01); *C30B 15/14* (2013.01); *C30B 15/20* (2013.01); *H01L 33/007* (2013.01)

(58) Field of Classification Search
CPC ......... C30B 29/22; C30B 15/14; C30B 15/20; H01L 33/007
See application file for complete search history.

(56) References Cited

U.S. PATENT DOCUMENTS

2019/0211470 A1    7/2019  Kizaki

FOREIGN PATENT DOCUMENTS

JP    2015-048296 A    3/2015
JP    2017-119597 A    7/2017
(Continued)

OTHER PUBLICATIONS

[NPL-1] Fukuda (JP 2017-119597 A), Jul. 2017 (EPO—machine translation to English). (Year: 2017).*

*Primary Examiner* — David Sample
*Assistant Examiner* — Donald M Flores, Jr.
(74) *Attorney, Agent, or Firm* — McDermott Will & Emery LLP

(57) ABSTRACT

A ScAlMgO₄ single crystal substrate having less collapse of crystal orientation, and a method for producing the single crystal substrate. A ScAlMgO₄ single crystal substrate is provided, wherein, when a center of the substrate is designated as coordinates (0,0) and a measurement beam width is set to 1 [mm]×7 [mm] to conduct analysis according to an X-ray diffraction method at respective coordinate positions of $(x_{-m},0)$ to $(x_m,0)$ at an interval of 1 [mm] in an x-axis direction and $(0,y_{-n})$ to $(0,y_n)$ at an interval of 1 mm in a y-axis direction, wherein m and n are each an integer falling within the range so that the measurement beam is not stuck out from the substrate, a worst value of a full width at half maximum of a rocking curve at each of the coordinate positions is less than 20 [sec.].

3 Claims, 3 Drawing Sheets

(51) Int. Cl.
    *H01L 33/00*     (2010.01)
    *C30B 15/20*     (2006.01)

(56) References Cited

FOREIGN PATENT DOCUMENTS

| | | | | |
|---|---|---|---|---|
| JP | 2017119597 A | * | 7/2017 | ............. C30B 29/22 |
| JP | 2017-214229 A | | 12/2017 | |
| JP | 2018-150198 A | | 9/2018 | |

* cited by examiner

SCAIMGO$_4$ SINGLE CRYSTAL SUBSTRATE AND METHOD FOR PRODUCING THE SAME

CROSS REFERENCE TO RELATED APPLICATIONS

This application is entitled to and claims the benefit of Japanese Patent Application No. 2018-050942, filed on Mar. 19, 2018, the disclosure of which including the specification, drawings and abstract is incorporated herein by reference in its entirety.

TECHNICAL FIELD

The present disclosure relates to a ScAlMgO$_4$ single crystal substrate and a method for producing the single crystal substrate.

BACKGROUND ART

In recent years, ScAlMgO$_4$ has attracted attention as a substrate for forming gallium nitride (GaN). ScAlMgO$_4$ has a lattice mismatch with GaN of about $\frac{1}{10}$ that of conventional sapphire, and is expected as a material for an increase in brightness of a light-emitting diode (LED).

The Czochralski method (hereinafter, also referred to as the "CZ method") is known as a method for producing a ScAlMgO$_4$ single crystal. The CZ method is a method including loading a material into a crucible disposed in a chamber, melting the material and then bringing a seed crystal into contact with a melt, and pulling the seed crystal with slow rotation by use of a pulling mechanism. According to the method, a single crystal having the same orientation as that of the seed crystal can be grown, and a cylindrical ingot can be obtained. Japanese Patent Application Laid-Open No. 2015-48296 and Japanese Patent Application Laid-Open No. 2017-119597 each describe a method for producing ScAlMgO$_4$.

SUMMARY

Technical Problem

When a single crystal is pulled according to the CZ method, the temperature gradient at the interface between the atmosphere immediately above a melt and the melt is needed to be high in order not to melt any seed crystal. That is, while the temperature of the melt is needed to be high for sufficiently melting a material, the temperature in a region close to the surface of the melt (atmosphere immediately above the melt) is needed to be a temperature at which no seed crystal is molten. An increased temperature gradient at the interface, however, causes the center of the melt (surface) to be easily cooled and causes crystal orientation to be easily collapsed at the center of the single crystal pulled. FIG. 1 illustrates a photograph of a wafer formed by cutout from a cylindrical single crystal prepared according to a conventional method, on the c-plane. Collapse of crystal orientation is observed as a black region when observed with a microscope. Collapse of crystal orientation is then caused around the center of a wafer prepared according to a conventional method, as illustrated FIG. 1.

FIG. 2 represents the full width at half maximum [sec.] at each position in analysis at an interval of about 4 mm in a region of ±20 mm from the center of the wafer according to an X-ray diffraction method for acquiring a rocking curve. The horizontal axis in FIG. 2 represents the distance from the center. As illustrated in FIG. 2, collapse of crystal orientation causes a broader full width at half maximum of the rocking curve obtained by analysis according to an X-ray diffraction method, thereby not providing any high-quality crystal.

An object of the present disclosure is then to provide a high-quality ScAlMgO$_4$ single crystal substrate with less collapse of crystal orientation, and a method for producing the single crystal substrate.

Solution to Problem

The present inventors have made intensive studies in order to solve the above problems, and thus have found that the crystal diameter and the crystal growth rate of a ScAlMgO$_4$ single crystal to be pulled are set to specific conditions to result in a reduction in collapse of crystal orientation of a single crystal to be obtained, thereby leading to the present disclosure.

The present disclosure provides the following ScAlMgO$_4$ single crystal substrate: a ScAlMgO$_4$ single crystal substrate in which, when a center of the substrate is designated as coordinates (0,0) and a measurement beam width is set to 1 [mm]×7 [mm] to conduct analysis according to an X-ray diffraction method at respective coordinate positions of $(x_{-m},0)$ to $(x_m,0)$ at an interval of 1 [mm] in an x-axis direction and $(0,y_{-n})$ to $(0,y_n)$ at an interval of 1 mm in a y-axis direction, in which m and n are each an integer falling within the range so that the measurement beam is not stuck out from the substrate, a worst value of a full width at half maximum of a rocking curve at each of the coordinate positions is less than 20 [sec.].

Further, the present disclosure provides the following method for producing a ScAlMgO$_4$ single crystal substrate: a method for producing a ScAlMgO$_4$ single crystal substrate in which a ScAlMgO$_4$ single crystal is produced by conduction pulling, with a seed crystal being in contact with a melt in a crucible, in which a product of a crystal growth rate d represented by the following Expression 1, and a one-third power of a diameter of a ScAlMgO$_4$ single crystal to be prepared, is 2.6 or more and less than 3.0:

$$\text{Crystal growth rate } d = c + (c \times b^2 \times q)/(a^2 \times p) \quad \text{(Expression 1)}$$

in which a represents an inner diameter of the crucible, b represents a diameter of the ScAlMgO$_4$ single crystal, c represents a pulling rate, p represents a liquid density of ScAlMgO$_4$, and q represents a solid density of ScAlMgO$_4$.

Advantageous Effects

The ScAlMgO$_4$ single crystal substrate of the present disclosure has less collapse of crystal orientation and is high in quality. The method for producing the ScAlMgO$_4$ single crystal substrate of the present disclosure can prepare a crystal at an optimal crystal growth rate depending on the crystal diameter. Thus, crystal orientation at the center of a single crystal is not collapsed and a high-quality ScAlMgO$_4$ single crystal substrate is obtained.

DESCRIPTION OF EMBODIMENTS

Hereinafter, one embodiment of the present disclosure will be described with reference to the accompanying drawings.

Figure 3:
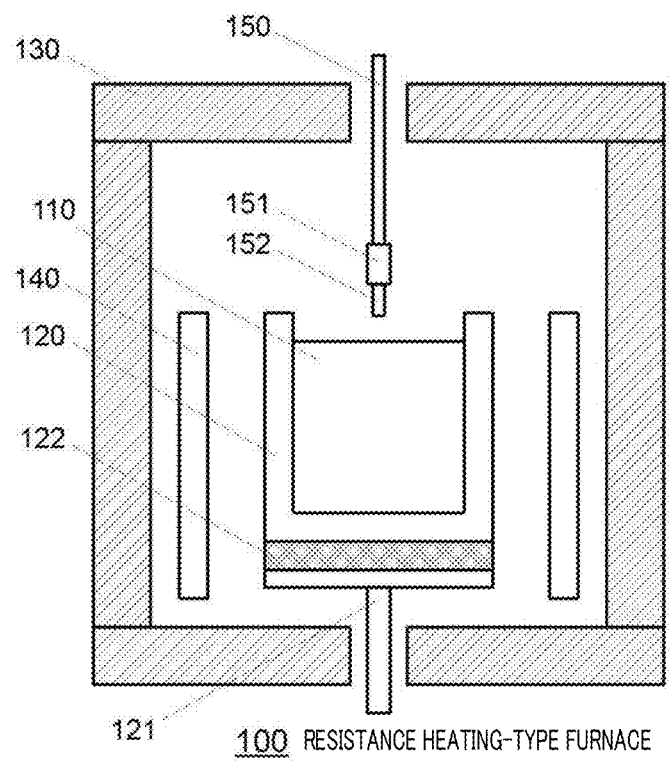
FIG. 3 illustrates a schematic view of a configuration of a resistance heating-type furnace for use in production of a ScAlMgO₄ single crystal substrate according to one embodiment of the present disclosure.
Figure 4:
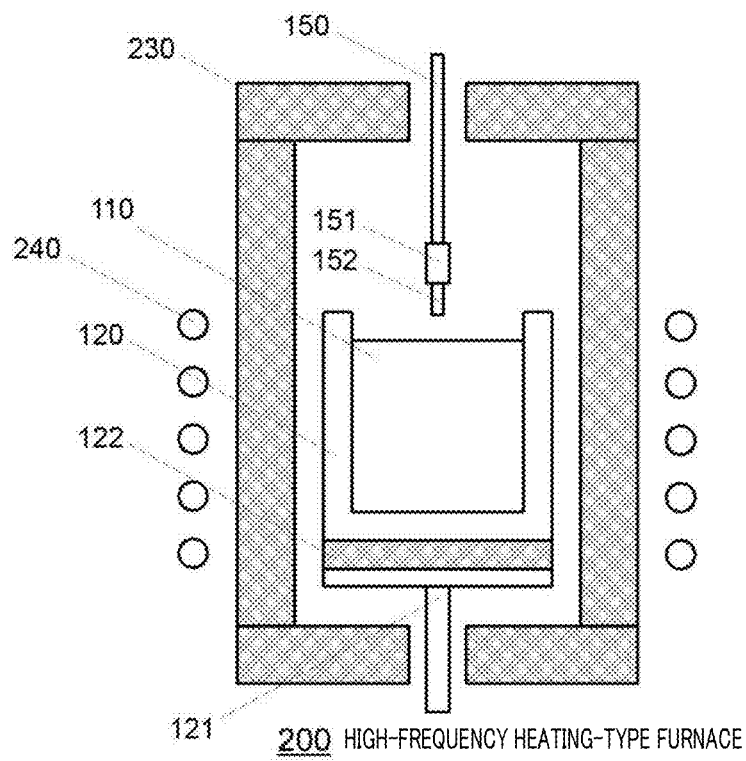
FIG. 4 illustrates a schematic view of a configuration of a high-frequency heating-type furnace for use in production of a ScAlMgO₄ single crystal substrate according to one embodiment of the present disclosure.

A ScAlMgO₄ single crystal substrate according to one embodiment of the present disclosure can be prepared in a heating apparatus. Examples of the heating apparatus that can prepare the ScAlMgO₄ single crystal substrate of the present embodiment include a resistance heating-type furnace or a high-frequency heating-type furnace. FIG. 3 and FIG. 4 illustrate respective schematic views of a configuration of resistance heating-type furnace 100 and a configuration of high-frequency heating-type furnace 200. Hereinafter, each method for producing the ScAlMgO₄ single crystal in a resistance heating manner or in a high-frequency heating manner will be described.

Resistance heating-type furnace 100 illustrated in FIG. 3 is a crystal-pulling apparatus according to a CZ method, and includes crucible 120 that melts ScAlMgO₄ raw material 110, crucible support shaft 121 that supports crucible 120, refractory material 122 to be disposed between crucible 120 and crucible support shaft 121, heater 140 to be disposed around crucible 120, heat insulation material 130 to surround crucible 120 and heater 140, crystal pulling shaft 150 that pulls a crystal, and seed holder 151 to be disposed at an end of crystal pulling shaft 150, which supports seed crystal 152. Herein, resistance heating-type furnace 100 may usually further include, for example, a chamber, a vacuum pump, a gas introduction port, a gas discharge port, a power source, and a controlling apparatus of a temperature or the like, which are necessary for pulling of a crystal according to the CZ method and which are not illustrated FIG. 1.

ScAlMgO₄ raw material 110 can be obtained by mixing scandium oxide (Sc₂O₃), aluminum oxide (Al₂O₃), and magnesium oxide (MgO), and melting the mixture in crucible 120 once.

In present embodiment, crucible 120 is made of iridium, and is a container that melts and retains ScAlMgO₄ raw material 110. In the present embodiment, crucible support shaft 121 is made of tungsten, and functions to rotate, and rise and fall at set rates.

In present embodiment, refractory material 122 is made of zirconia, and has reaction resistance to both the materials of crucible 120 and crucible support shaft 121.

In present embodiment, heat insulation material 130 is a cylindrical member made of carbon, and has an upper surface where a through-hole for insertion of crystal pulling shaft 150 is disposed and has a bottom surface where a through-hole for insertion of crucible support shaft 121 is disposed.

In present embodiment, heater 140 has a resistance heating-type heat generation section tubular shaped and made of carbon, and application of a current to heater 140 allows the heat generation section to generate heat, thereby heating a material in crucible 120.

In present embodiment, crystal pulling shaft 150 is made of alumina, and functions to rotate, and rise and fall at set rates. Seed holder 151 is made of iridium. Seed holder 151 is connected to one end of crystal pulling shaft 150, and seed crystal 152 can be mounted to a tip. Seed crystal 152 is made of ScAlMgO₄, and has a square prism shape.

When a ScAlMgO₄ substrate is prepared by use of resistance heating-type furnace 100, first, melting of ScAlMgO₄ raw material 110 is performed. In melting, a space surrounded by heat insulation material 130 is subjected to vacuuming and thereafter the atmosphere of the space is filled with an inert gas and is thus at ordinary pressure, in order that an inert gas atmosphere is made. The power source of heater 140 is then turned on to perform heating with a gradual increase in the power to be applied to heater 140 over time to such an extent that a large load is not applied to crucible 120, until the temperature reaches a temperature at which ScAlMgO₄ raw material 110 is molten.

After melting of ScAlMgO₄ raw material 110 is confirmed, crystal pulling shaft 150 is allowed to gradually fall down with being rotated at a constant rate until seed crystal 152 is brought into contact with ScAlMgO₄ raw material 110 molten. Here, the rotation speed of crystal pulling shaft 150 is preferably between 1 rpm and 10 rpm. After the melt temperature of ScAlMgO₄ raw material 110 molten is stabilized at a temperature suitable for pulling of a crystal, crystal pulling shaft 150 is allowed to rise with being rotated at a constant rate. Here, the rotation speed of crystal pulling shaft 150 is preferably between 1 rpm and 10 rpm. After the start of pulling, the shape of a crystal to be prepared, for example, the diameter is controlled by automatic diameter control (ADC). After the crystal is then pulled to a desired length, the crystal is cut and separated from a melt of ScAlMgO₄ raw material 110 molten. Thereafter, cooling is performed with a gradual decrease in the power to be applied to heater 140 over time to such an extent that a large load is not applied to crucible 120 or the crystal pulled.

On the other hand, high-frequency heating-type furnace 200 illustrated in FIG. 4 has the same configuration as that of resistance heating-type furnace 100 above, except for including heat insulation material 230 and heating coil 240 instead of heat insulation material 130 and heater 140. The same reference numerals are given to the same components in FIG. 4, and the detailed description is omitted.

In present embodiment, heat insulation material 230 is made of zirconia, and is disposed so as to surround crucible 120. On the other hand, heating coil 240 is disposed outside of heat insulation material 230, and application of a high-frequency current to heating coil 240 generates a high frequency magnetic flux. The high frequency magnetic flux then generates an eddy current in crucible 120, and generates heat on the surface of crucible 120, resulting in heating of ScAlMgO₄ raw material 110 in crucible 120.

When a ScAlMgO$_4$ substrate is prepared by use of high-frequency heating-type furnace 200, first, melting of ScAlMgO$_4$ raw material 110 is performed. In such melting, a space surrounded by heat insulation material 230 is subjected to vacuuming and thereafter the atmosphere of the space is filled with an inert gas and is thus at ordinary pressure, in order that an inert gas atmosphere is made. The power source of heating coil 240 is then turned on to perform heating with a gradual increase in the power to be applied to heating coil 240 over time to such an extent that a large load is not applied to crucible 120, until the temperature reaches a temperature at which ScAlMgO$_4$ raw material 110 is molten.

After melting of ScAlMgO$_4$ raw material 110 is confirmed, crystal pulling shaft 150 is allowed to gradually fall down until seed crystal 152 is brought into contact with crucible 120 by production of a crystal. The crystal growth rate d [mm/h] can be represented by the following Expression 1 under the assumption that the inner diameter of crucible 120 is defined as a [mm], the crystal diameter of a crystal pulled is defined as b [mm], the pulling rate of pulling shaft 150 is defined as c [mm/h], and the liquid density and the solid density of ScAlMgO$_4$ raw material 110 are defined as p (usually 3.0 [g/cm$^3$]) and q (usually 3.5 [g/cm$^3$]), respectively.

$$\text{Crystal growth rate } d = c + (c \times b^2 \times q)/(a^2 \times p) \qquad \text{(Expression 1)}$$

The numerical value e shown in Table 1 is obtained from the crystal growth rate d [mm/h] and the crystal diameter b [mm] of each ScAlMgO$_4$ single crystal prepared, according to the following Expression 2.

$$\text{Numerical value } e = d \times b^{1/3} \qquad \text{(Expression 2)}$$

TABLE 1

| | Inner diameter a of crucible [mm] | Crystal diameter b [mm] | Pulling rate c [mm/h] | Crystal growth rate d [mm/h] | Crystal growth rate d × (crystal diameter b)$^{1/3}$ e | Collapse of crystal orientation | Worst value f [sec.] of full width at half maximum |
|---|---|---|---|---|---|---|---|
| Example 1 | 76 | 20 | 0.9 | 1.0 | 2.6 | Not collapsed | 19 |
| Example 2 | 76 | 28 | 0.8 | 0.9 | 2.8 | Not collapsed | 15 |
| Example 3 | 144 | 79 | 0.5 | 0.7 | 2.9 | Not collapsed | 18 |
| Comparative Example 1 | 74 | 40 | 1.0 | 1.3 | 4.6 | Collapsed | 47 |
| Comparative Example 2 | 76 | 40 | 0.7 | 0.9 | 3.2 | Collapsed | 28 |
| Comparative Example 3 | 74 | 25 | 1.0 | 1.1 | 3.3 | Collapsed | 41 |
| Comparative Example 4 | 76 | 38 | 0.7 | 0.9 | 3.0 | Collapsed | 24 |
| Comparative Example 5 | 76 | 48 | 0.6 | 0.9 | 3.2 | Collapsed | 34 |
| Comparative Example 6 | 76 | 40 | 0.3 | 0.4 | 1.4 | Not collapsed | 39 |

ScAlMgO$_4$ raw material 110 molten. After the melt temperature of ScAlMgO$_4$ raw material 110 molten is stabilized at a temperature suitable for pulling of a crystal, crystal pulling shaft 150 is allowed to rise at a constant rate. After the start of pulling, the shape of a crystal to be prepared, for example, the diameter, is controlled by automatic diameter control (ADC). After the crystal is pulled to a desired length, the crystal is cut and separated from a melt of ScAlMgO$_4$ raw material 110 molten. Thereafter, cooling is performed with a gradual decrease in the power to be applied to heating coil 240 over time to such an extent that a large load is not applied to crucible 120.

The results of preparation of each ScAlMgO$_4$ single crystal substrate by use of resistance heating-type furnace 100 in FIG. 3 or high-frequency heating-type furnace 200 in FIG. 4 are shown in Table 1. The Table shows whether or not collapse of crystal orientation is observed at the center of each crystal to be prepared in the change in any of the inner diameter of crucible 120, the diameter of each ScAlMgO$_4$ single crystal prepared, and the pulling rate of crystal pulling shaft 150 in Comparative Examples 1 to 6 and Examples 1 to 3.

Figure 1:
FIG. 1 illustrates collapse of crystal orientation of a ScAlMgO$_4$ single crystal prepared according to a conventional method.
Figure 2:
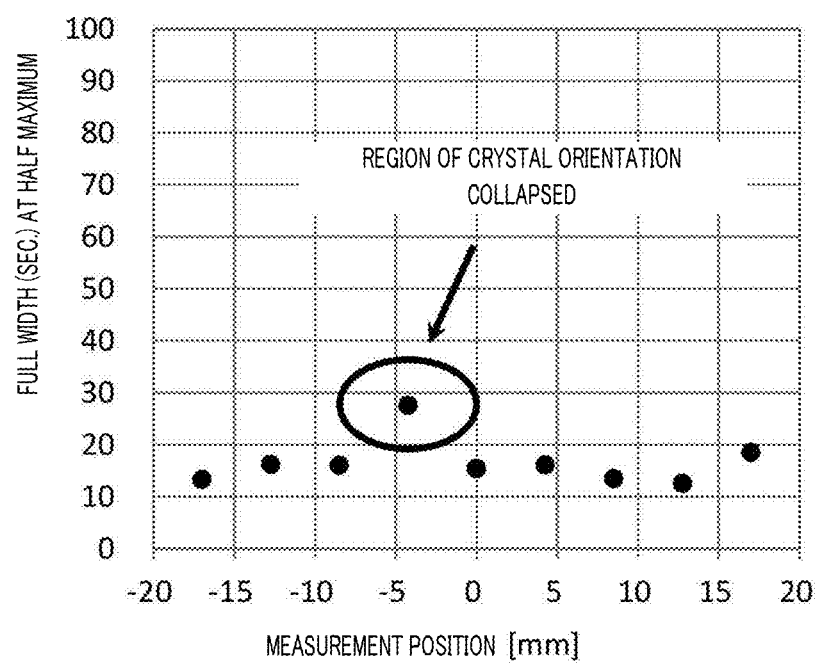
FIG. 2 represents the full width at half maximum in analysis of the ScAlMgO₄ single crystal illustrated in FIG. 1 according to an X-ray diffraction method for acquiring a rocking curve.

The crystal growth rate d in Table 1 here represents the variation (growth rate) in the actual length of each crystal in consideration of not only the pulling rate of pulling shaft 150 in pulling of each crystal, but also the rate of the melt surface falling due to a decrease of ScAlMgO$_4$ raw material 110 in As shown in Table 1 above, crystal orientation collapse was observed at the center of a crystal in each of Comparative Examples 1 to 5 in which a ScAlMgO$_4$ single crystal substrate was prepared so that the value represented by e was 3.0 or more. On the other hand, crystal orientation collapse was not observed at the center of a crystal in each of Examples 1 to 3 and Comparative Example 6 in which a ScAlMgO$_4$ single crystal substrate was prepared so that the value represented by e was less than 3.0. It was clear from Table 1 above that crystal orientation collapse as illustrated in FIG. 1 is not observed at the center of a crystal by allowing the value represented by e to be less than 3.0 in production of a ScAlMgO$_4$ single crystal even when the diameter of a single crystal was 20 [mm] or more. A ScAlMgO$_4$ substrate having no crystal orientation collapse at the center of a crystal and having a diameter of 20 [mm] or more can be used as in other substrates for production of GaN, such as sapphire.

Table 1 here also shows the worst value [sec.] (the worst value f [sec.]) among the full widths at half maximum of the rocking curve at a plurality of positions in analysis of a wafer formed by cutout from a crystal pulled, on the c-plane, according to an X-ray diffraction method. The worst value f was specifically identified as follows.

D8 DISCOVER (manufactured by Bruker AXS) was used for X-ray diffraction of the wafer. The analysis was conducted at an interval of 1 [mm] and a measurement beam width of 1 [mm]×7 [mm] by measurement at each coordinate position in the range of ±0.025 [°] with a step of 0.0001 [°]. In order to detect whether or not crystal collapse was present at the center, the analysis was conducted in the range from $(x_{-m},0)$ to $(x_m,0)$ at an interval of 1 [mm] in the x-axis direction (namely, $(x_{-m},0)$, $(x_{-(m-1)},0)$, . . . , (−2,0), (−1,0), (0,0), (1,0), (2,0), . . . , $(x_{m-1},0)$, $(x_m,0)$) when the center of a wafer (substrate) was designated as coordinates (0,0). The analysis was also conducted at an interval of 1 [mm] in the range from $(0,y_{-n})$ to $(0,y_n)$ in the y-axis direction (namely, $(0,y_{-n})$, $(0,y_{-(n-1)})$, . . . , (0,−2), (0,−1), (0,0), (0,1), (0,2), . . . , $(0,y_{n-1})$, $(0,y_n)$). It is noted that m and n are each an integer and each fall within the range so that no beam is stuck out from the substrate. The full width at half maximum of the rocking curve at each coordinate position was identified and the worst value f thereof was identified.

Figure 5:
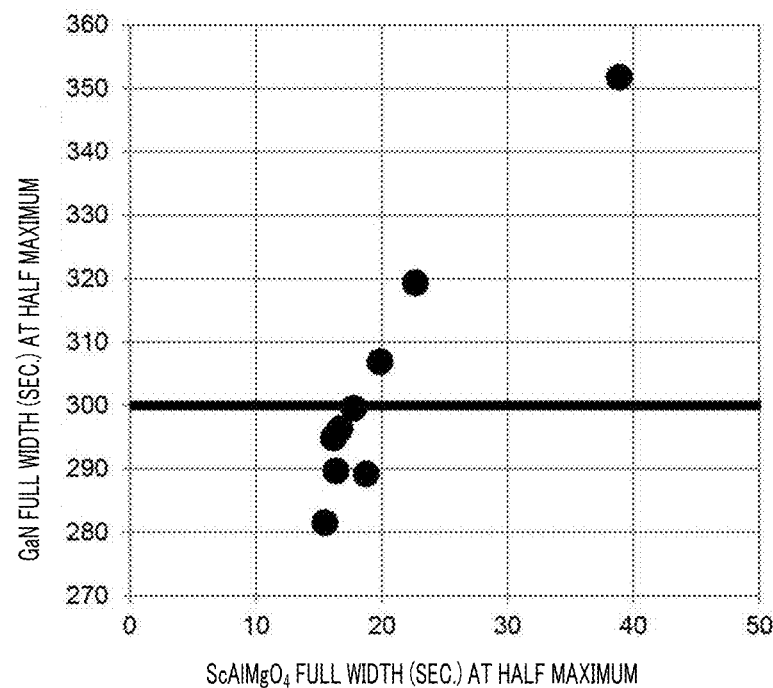
FIG. 5 represents a relationship between the full width at half maximum of a ScAlMgO₄ single crystal substrate and the full width at half maximum of a GaN crystal prepared on the single crystal substrate.

A preferable range of the worst value f of the full width at half maximum is here described. FIG. 5 shows a relationship between the full width at half maximum of a ScAlMgO$_4$ single crystal substrate and the full width at half maximum of a GaN crystal formed on the ScAlMgO$_4$ single crystal substrate. The full width at half maximum of a GaN crystal is needed to be usually 300 [sec.] or less. It is then clear from FIG. 5 that, when the full width at half maximum of a ScAlMgO$_4$ single crystal is more than 20 [sec.], the full width at half maximum of a GaN crystal is more than 300 [sec.]. In other words, it is found that the worst value of the full width at half maximum of a ScAlMgO$_4$ single crystal is needed to be less than 20 [sec.].

The present inventors have made intensive studies, and as a result, have found that the value represented by e, namely, the product of the crystal growth rate d and the one-third power of the diameter of a crystal to be prepared may be less than 3.0 in order that the worst value f of the full width at half maximum of a ScAlMgO$_4$ single crystal is less than 20 [sec.]. It is considered that the value represented by e is less than 3.0 to thereby allow the pulling rate of a seed crystal to be properly controlled and allow a reduction in the temperature at the center of a melt to be suppressed. As a result, not only collapse of crystal orientation around the center of a single crystal to be produced is hardly caused, but also the worst value of the full width at half maximum of the entire single crystal to be produced can be less than 20 [sec.]. These are also clear from the above Examples. Hereinafter, these will be described in detail.

Figure 6:
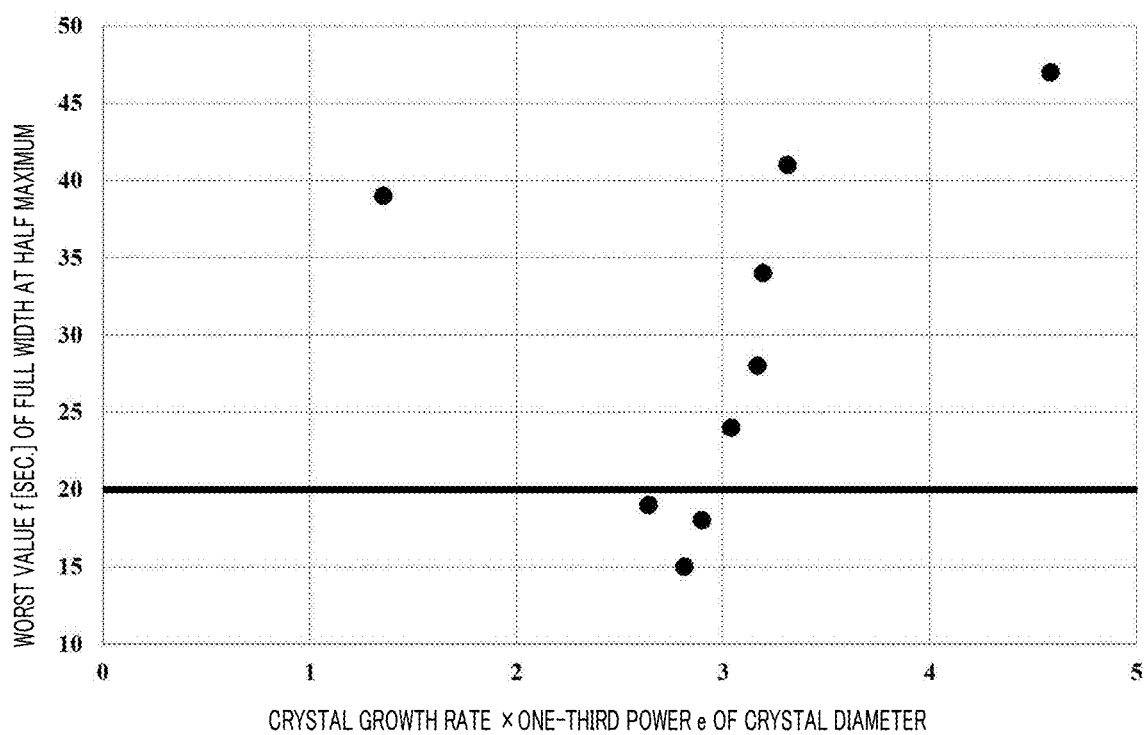
FIG. 6 represents a relationship between the product of the crystal growth rate and the one-third power of the crystal diameter in preparation of each ScAlMgO₄ single crystal substrate of Examples and Comparative Examples of the present disclosure, and the worst value f [sec.] of the full width at half maximum of the rocking curve of the ScAlMgO₄ single crystal substrate prepared.

FIG. 6 shows a relationship between the value represented by e, of the ScAlMgO$_4$ single crystal substrate prepared in each of Examples and Comparative Examples above, and the worst value f [sec.] of the full width at half maximum of ScAlMgO$_4$. As illustrated in FIG. 6, when the value represented by e is 2.8, the worst value f [sec.] of the full width at half maximum is at the minimum, and when the value e is more than 2.8, the worst value f [sec.] increases. When e is set to less than 3.0, the worst value of the full width at half maximum of a ScAlMgO$_4$ single crystal, at each measurement coordinate described above, is less than 20 [sec.]. On the other hand, also when the value represented by e is less than 2.8, the worst value f [sec.] increases. For example, as in Comparative Example 6, when e was 1.4, collapse of crystal orientation was not observed at the center, but the worst value of the full width at half maximum of the rocking curve was 39 [sec.] and such a value exceeds a threshold value of 20 [sec.] that allows the full width at half maximum of a GaN crystal to be 300 [sec.] or less.

The lower limit of the value represented by e is then 2.6. The worst value of the full width at half maximum was 19 [sec.] and thus the worst value was less than 20 [sec.] in Example 1 where no crystal orientation collapse was observed and e was 2.6. Accordingly, it is supported by Example 1 that the lower limit is preferably 2.6.

Heat insulation material 130 of resistance heating-type furnace 100 is made of carbon and heat insulation material 230 of high-frequency heating-type furnace 200 is made of zirconia in the above description, but are not limited thereto. Crucible 120 and seed holder 151, crucible support shaft 121, refractory material 122, crystal pulling shaft 150, and the like are also not limited to those described above, as long as the objects and the effects of the present disclosure are not impaired. Heater 140 is also not limited to one made of carbon, and can also be a heater made of a metal such as tungsten.

The ScAlMgO$_4$ single crystal substrate of the present disclosure has, as the entire substrate, a narrow full width at half maximum of the rocking curve to be obtained from analysis according to an X-ray diffraction method, and is useful as, for example, a substrate for preparation of GaN. The above method for producing the ScAlMgO$_4$ single crystal substrate can allow a crystal to be pulled at an optimal crystal growth rate depending on the crystal diameter, and therefore a high-quality ScAlMgO$_4$ single crystal substrate narrow in the full width at half maximum of the rocking curve and with less collapse of crystal orientation is obtained.

INDUSTRIAL APPLICABILITY

According to the present disclosure, a high-quality ScAlMgO$_4$ single crystal substrate that can be used in, for example, preparation of GaN, and a method for producing the single crystal substrate are provided. Accordingly, the present disclosure is very useful for production of various semiconductors.

REFERENCE SIGNS LIST 100 resistance heating-type furnace
110 ScAlMgO$_4$ raw material
120 crucible
121 crucible support shaft
122 refractory material
130 heat insulation material
140 heater
150 crystal pulling shaft
151 seed holder
152 seed crystal
200 high-frequency heating-type furnace
230 heat insulation material
240 heating coil

The invention claimed is:

1. A ScAlMgO$_4$ single crystal substrate wherein, when a center of the substrate is designated as coordinates (0,0) and a measurement beam width is set to 1 [mm]×7 [mm] to conduct analysis according to an X-ray diffraction method at respective coordinate positions of $(x_{-m},0)$ to $(x_m,0)$ at an interval of 1 [mm] in an x-axis direction and $(0,y_{-n})$ to $(0,y_n)$ at an interval of 1 mm in a y-axis direction, wherein m and n are each an integer falling within the range so that the measurement beam is not stuck out from the substrate, a worst value of a full width at half maximum of a rocking curve at each of the coordinate positions is less than 20 [sec.].

2. The ScAlMgO$_4$ single crystal substrate according to claim 1, wherein the substrate is in a size having a diameter of 20 mm or more.

3. A method for producing the ScAlMgO$_4$ single crystal substrate of claim 1, in which a ScAlMgO$_4$ single crystal is produced by conduction pulling, with a seed crystal being in contact with a melt in a crucible, wherein a product of a crystal growth rate d represented by the following Expression 1, and a one-third power of a diameter of a ScAlMgO$_4$ single crystal to be prepared, is 2.6 or more and less than 3.0:

$$\text{Crystal growth rate } d = c + (c \times b^2 \times q)/(a^2 \times p) \quad \text{(Expression 1)}$$

wherein a represents an inner diameter of the crucible, b represents a diameter of the ScAlMgO$_4$ single crystal, c represents a pulling rate, p represents a liquid density of ScAlMgO$_4$, and q represents a solid density of ScAlMgO$_4$.

\* \* \* \* \*